United States Patent
Klein

(10) Patent No.: US 9,142,263 B2
(45) Date of Patent: *Sep. 22, 2015

(54) POWER MANAGEMENT CONTROL AND CONTROLLING MEMORY REFRESH OPERATIONS

(71) Applicant: Round Rock Research, LLC, Jersey City, NJ (US)

(72) Inventor: Dean A. Klein, Eagle, ID (US)

(73) Assignee: Round Rock Research, LLC, Parsippany, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/140,041

(22) Filed: Dec. 24, 2013

(65) Prior Publication Data

US 2014/0112087 A1 Apr. 24, 2014

Related U.S. Application Data

(63) Continuation of application No. 12/367,216, filed on Feb. 6, 2009, now Pat. No. 8,619,485, which is a continuation of application No. 10/796,111, filed on Mar. 10, 2004, now Pat. No. 7,583,551.

(51) Int. Cl.
  *G11C 7/00* (2006.01)
  *G11C 11/406* (2006.01)

(52) U.S. Cl.
  CPC ............ *G11C 7/00* (2013.01); *G11C 11/40611* (2013.01); *G11C 11/40626* (2013.01)

(58) Field of Classification Search
  USPC .................. 365/222, 189.04, 189.06, 189.08
  See application file for complete search history.

(56) References Cited

U.S. PATENT DOCUMENTS

| | | | |
|---|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |

(Continued)

FOREIGN PATENT DOCUMENTS

| | | |
|---|---|---|
| JP | 56126916 A | 10/1981 |
| WO | 97/48032 A2 | 12/1997 |
| WO | 99/28914 A2 | 6/1999 |

OTHER PUBLICATIONS

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

(Continued)

*Primary Examiner* — Pho M Luu
(74) *Attorney, Agent, or Firm* — Lerner, David, Littenberg, Krumholz & Mentlik, LLP

(57) ABSTRACT

A memory device providing signals indicating when refresh operations are complete. The signals from a number of memory devices can be combined, such as by logically ORing, to provide a refresh complete signal to a power management controller. Dynamic factors can affect the refresh operation and the memory may be refreshed without restoring the entire system to a high power state. The time required to perform a refresh operation can be determined dynamically, allowing the system to be returned to a low power state as soon as refresh is complete. Ambient temperatures can be monitored to dynamically determine when to perform a refresh operation.

12 Claims, 7 Drawing Sheets

(56) References Cited

U.S. PATENT DOCUMENTS

| | | |
|---|---|---|
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,625,296 A | 11/1986 | Shriver |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,682,306 A | 7/1987 | Sakurai et al. |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,270,967 A | 12/1993 | Moazzami et al. |
| 5,272,359 A | 12/1993 | Nagasubramanian et al. |
| 5,296,716 A | 3/1994 | Ovshinsky et al. |
| 5,314,772 A | 5/1994 | Kozicki et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,418,920 A | 5/1995 | Kuddes |
| 5,446,696 A | 8/1995 | Ware et al. |
| 5,500,532 A | 3/1996 | Kozicki |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,634,106 A | 5/1997 | Yaezawa et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,777,921 A | 7/1998 | Takata et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,912,839 A | 6/1999 | Ovshinsky et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,064,303 A | 5/2000 | Klein et al. |
| 6,072,716 A | 6/2000 | Jacobson et al. |
| 6,077,729 A | 6/2000 | Harshfield |
| 6,087,674 A | 7/2000 | Ovshinsky et al. |
| 6,107,918 A | 8/2000 | Klein et al. |
| 6,117,720 A | 9/2000 | Harshfield |
| 6,124,728 A | 9/2000 | Nishimura et al. |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,350,679 B1 | 2/2002 | McDaniel et al. |
| 6,359,823 B2 * | 3/2002 | Mullarkey ............... 365/222 |
| 6,367,020 B1 | 4/2002 | Klein |
| 6,376,284 B1 | 4/2002 | Gonzalez et al. |
| 6,388,324 B2 | 5/2002 | Kozicki |
| 6,391,688 B1 | 5/2002 | Gonzalez et al. |
| 6,401,209 B1 | 6/2002 | Klein |
| 6,404,665 B1 | 6/2002 | Lowrey et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,426,909 B1 | 7/2002 | Tomita |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,483,764 B2 | 11/2002 | Chen Hsu et al. |
| 6,487,113 B1 | 11/2002 | Park et al. |
| 6,501,111 B1 | 12/2002 | Lowrey |
| 6,501,699 B2 | 12/2002 | Mizugaki |
| 6,507,061 B1 | 1/2003 | Klersy et al. |
| 6,511,862 B2 | 1/2003 | Hudgens et al. |
| 6,511,867 B2 | 1/2003 | Lowrey et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowrey et al. |
| 6,549,479 B2 | 4/2003 | Blodgett |
| 6,555,860 B2 | 4/2003 | Lowrey et al. |
| 6,563,164 B2 | 5/2003 | Lowrey et al. |
| 6,566,700 B2 | 5/2003 | Xu |
| 6,567,293 B1 | 5/2003 | Lowrey et al. |
| 6,567,332 B2 | 5/2003 | Sawhney |
| 6,569,705 B2 | 5/2003 | Chiang et al. |
| 6,570,784 B2 | 5/2003 | Lowrey |
| 6,576,921 B2 | 6/2003 | Lowrey |
| 6,586,761 B2 | 7/2003 | Lowrey |
| 6,589,714 B2 | 7/2003 | Maimon et al. |
| 6,590,807 B2 | 7/2003 | Lowrey |
| 6,593,176 B2 | 7/2003 | Dennison |

(56) References Cited

U.S. PATENT DOCUMENTS

| | | | |
|---|---|---|---|
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowrey et al. | |
| 6,628,559 B2 | 9/2003 | Shimizu et al. | |
| 6,642,102 B2 | 11/2003 | Xu | |
| 6,646,297 B2 | 11/2003 | Dennison | |
| 6,649,928 B2 | 11/2003 | Dennison | |
| 6,654,303 B2 | 11/2003 | Miyamoto et al. | |
| 6,667,900 B2 | 12/2003 | Lowrey et al. | |
| 6,671,710 B2 | 12/2003 | Ovshinsky et al. | |
| 6,673,648 B2 | 1/2004 | Lowrey | |
| 6,673,700 B2 | 1/2004 | Dennison et al. | |
| 6,674,115 B2 | 1/2004 | Hudgens et al. | |
| 6,687,153 B2 | 2/2004 | Lowrey | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,697,910 B2 | 2/2004 | Tsukude et al. | |
| 6,707,712 B2 | 3/2004 | Lowery | |
| 6,714,473 B1 | 3/2004 | Fiscus | |
| 6,714,954 B2 | 3/2004 | Ovshinsky et al. | |
| 6,751,144 B2 | 6/2004 | Takahashi et al. | |
| 6,778,457 B1 | 8/2004 | Burgan | |
| 6,788,606 B2 * | 9/2004 | Fibranz et al. | 365/222 |
| 6,909,657 B2 | 6/2005 | Jakobs et al. | |
| 6,925,022 B2 * | 8/2005 | Arimoto et al. | 365/222 |
| 6,956,782 B2 | 10/2005 | Hoehler | |
| 7,583,551 B2 * | 9/2009 | Klein | 365/222 |
| 8,619,485 B2 * | 12/2013 | Klein | 365/222 |
| 2001/0033511 A1 | 10/2001 | Saito et al. | |
| 2002/0000666 A1 | 1/2002 | Kozicki | |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168852 A1 | 11/2002 | Harshfield et al. | |
| 2002/0190289 A1 | 12/2002 | Harshfield et al. | |
| 2002/0191467 A1 | 12/2002 | Matsumoto et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048744 A1 | 3/2003 | Ovshinsky et al. | |
| 2003/0049912 A1 | 3/2003 | Campbell et al. | |
| 2003/0068861 A1 | 4/2003 | Li et al. | |
| 2003/0068862 A1 | 4/2003 | Li et al. | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki | |
| 2003/0210564 A1 | 11/2003 | Kozicki | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

OTHER PUBLICATIONS

El Ghrandi, R.; Calas, J.; Galibert, G.; Averous, M., Silver photodissolution in amorphous chalcogenide thin films, Thin Solid Films 218 (1992) 259-273.

El-kady, Y.L., The threshold switching in semiconducting glass Ge21Se17Te62, Indian J. Phys. 70A (1996) 507-516.

Ei-Zahed, H.; El-Korashy, A., Influence of composition on the electrical and optical properties of Ge20BixSe80-x films, Thin Solid Films 376 (2000) 236-240.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vaccum 46 (1995) 701-707.

Fadel, M., Switching phenomenon in evaporated Se—Ge—As thin films of amorphous chalcogenide glass, Vacuum 44 (1993) 851-855.

Fadel, M.; Ei-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag—GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat: Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M., Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge—Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C.; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si: H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hajto, J.; Rose, M.J.; Osborne, I.S.; Snell, A.J.; Le Comber, P.G.; Owen, A.E., Quantization effects in metal/a-Si:H/ metal devices, Int. J. Electronics 73 (1992) 911-913.

(56) References Cited

OTHER PUBLICATIONS

Halfz, M.M.; Ibrahim, M.M.; Dongol, M.; Hammad, F.H., Effect of composition on the structure and electrical properties of As—Se—Cu glasses, J. Apply. Phys. 54 (1983) 1950-1954.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., Intralevel hybrid resist process with submicron capability, SPIE vol. 333 Submicron Lithography, pp. 24-29 (1982).

Hilt, Dissertation: Materials characterization of Silver Chalcogenide Programmable Metalization Cells, Arizona State University, pp. Title p.-114 (UMI Company, May 1999).

Holmquist et al., Reaction and Diffusion in Silver-Arsenic Chalcogenide Glass Systems, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy $GexSe1-x$ around the stiffness threshold composition, J. Optoelectronics and Advanced Materials 3 (2001) 199-214.

Hu, J.; Hajto, J.; Snell, A.J.; Owen.; A.E.; Rose, M.J., Capacitance anomaly near the metal-non-metal transition in Cr-hydrogenated amorphous Si—V thin-film devices, Phil. Mag. B. 74 (1996) 37-50.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Snell, A.J.; Hajto, J.; Owen, A.E., Current-induced instability in Cr—p+a-Si:H—V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As—Te—Ge, Solid State Comm. 8 (1970) 153-155.

Institute of Physics Publishing, Ltd., Tugluoglu et al., "Temperature dependent barrier characteristics of Ag/p—SnSe Schottky diodes based on I-V-T measurements", pp. 1092-1097, 2004, UK.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L16-L18.

Joullie, A.M.; Marucchi, J., Electrical properties of the amorphous alloy As2Se5, Mat. Res. Bull. 8 (1973) 433-442.

Joullie, A.M.; Marucchi, J., On the DC electrical conduction of amorphous As2Se7 before switching, Phys. Stat. Sol. (a) 13 (1972) K105-K109.

Kaplan, T.; Adler, D., Electrothermal switching in amorphous semiconductors, J. Non-Cryst. Solids 8-10 (1972) 538-543.

Kawaguchi et al., Mechanism of photosurface deposition, 164-166 J. Non-Cryst. Solids, pp. 1231-1234 (1993).

Kawaguchi, T.; Maruno, S.; Elliott, S.R., Optical, electrical, and structural properties of amorphous Ag—Ge—S and Ag—Ge—Se films and comparison of photoinduced and thermally induced phenomena of both system, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3) 1-x (0<=x<=0.571) glasses, Solid state Ionics 123 (1999) 259-269.

Kluge, G.; Thomas, A.; Klabes, R.; Grotzschel, R., Silver photodiffusion in amorphous $GexSe100-x$, J. Non-Cryst. Solids 124 (1990) 186-193.

Kolobov, A.V., Lateral diffusion of silver in vitreous chalcogenide films, J. Non-Cryst. Solids 137-138 (1991) 1027-1030.

Kolobov, A.V., On the origin of p-type conductivity in amorphous chalcogenides, J. Non-Cryst. Solids 198-200 (1996) 728-731.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Applications of Programmable Resistance Changes in Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag—Ge—Se glasses, Microelectronic Engineering 63 (2002) pp. 155-159.

Kozicki et al., Silver incorporation in thin films of selenium rich Ge—Se glasses, International Congress on Glass, vol. 2, Extended Abstracts, Jul. 2001, pp. 8-9.

Lakshminarayan, K.N.; Srivastava, K.K.; Panswar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. Phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in $GexSe1-x$ glass, Appl. Phys. Lett. 46 (1985) 543-545.

Matsushita, T.; Yamagami, T.; Okuda, M., Polarized memory effect observed on amorphous selenium thin films, Jpn. J. Appl. Phys. 11 (1972) 606.

Matsushita, T.; Yamagami, T.; Okuda, M., Polarized memory effect observed on Se—SnO2 system, Jap. J. Appl. Phys. 11 (1972) 1657-1662.

Mazurier, F.; Levy, M.; Souquet, J.L, Reversible and irreversible electrical switching in TeO2-V2O5 based glasses, Journal de Physique IV 2 (1982) C2-185-C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni, Bi), Mat. Chem. and Phys. 28 (1991) 253-258.

Michael N. Kozicki, 1. Programmable Metallization Cell Technology Description, Feb. 18, 2000.

Michael N. Kozicki, Axon Technologies Corp. and Arizona State University, Presentation to Micron Tecnology, Inc., Apr. 6, 2000.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge—Se glasses used in programmable metallization cell devices, J. Non-Cryst. Solids 299-302 (2002) 1023-1027.

Miyatani, S.-y., Electronic and ionic conduction in $(AgxCu1-x)2Se$, J. Phys. Soc. Japan 34 (1973) 423-432.

Miyatani, S.-y., Electronic properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, K.; Kitagawa, A.; Suzuki, M., Submicron nonvolatile memory cell based on reversible phase transition in chalcogenide glasses, Jpn. J. Appl. Phys. 39 (2000) 6157-6161.

(56) References Cited

OTHER PUBLICATIONS

Nang, T.T.; Okuda, M.; Matsushita, T.; Yokota, S.; Suzuki, A., Electrical and optical parameters of GexSe1−x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Nature Publishing Group, Lankhorst et al, "Low-cost and nanoscale on-volatile memory concept for future silicon chips", pp. 347-352, 2005.

Neale, R.G.; Aseltine, J.A., The application of amorphous materials to computer memories, IEEE transactions on electron dev. Ed-20 (1973) 195-209.

Ovshinsky S.R., Reversible electrical switching phenomena in disordered structures, Phys. Rev. Lett. 21 (1968) 1450-1453.

Ovshinsky S.R.; Fritzsche, H., Reversible structural transformations in amorphous semiconductors for memory and logic, Mettalurgical transactions 2 (1971) 641-645.

Owen et al., Metal-Chalcogenide Photoresists for High Resolution Lithography and Sub-Micron Structures, Nanostructure Physics and Fabrication, pp. 447-451 (M. Reed ed. 1989).

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen, A.E.; Lecomber, P.G.; Sarrabayrouse, G.; Spear, W.E., New amorphous-silicon electrically programmable nonvolatile switching device, IEE Proc. 129 (1982) 51-54.

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge—As—Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge—As—Te glasses, J. Phys. D: Appl. Phys. 29 (1996) 2004-2008.

Rahman, S.; Sivarama Sastry, G., Electronic switching in Ge—Bi—Se—Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.; Snell,A.J.;Lecomber,P.G.;Hajto, J.;Fitzgerald,A.G. ;Owen,A.E., Aspects of non-volatility in a-Si:H memory devices, Mat. Res. Soc. Symp. Proc. V 258, 1992, 1075-1080.

Rose,M.J.;Hajto, J.;Lecomber,P.G.;Gage,S.M.;Choi,W.K.;Snell,A. J.;Owen,A.E., Amorphous silicon analogue memory devices, J. Non-Cryst. Solids 115 (1989) 168-170.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Abdel-All, A.; Elshafie,A.; Elhawary, M.M., DC electric-field effect in bulk and thin-film Ge5As38Te57 chalcogenide glass, Vacuum 59 (2000)845-853.

Adler, D.; Henisch, H.K.; Matt, S.N., The mechanism of threshold switching in amorphous alloys, Rev. Mod. Phys. 50 (1978) 209-220.

Adler, D.; Moss, S.C., Amorphous memories and bistable switches, J. Vac. Sci. Technol. 9 (1972) 1182-1189.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A Electrical & thermal conductivity of the amorphous semiconductor GexSe1−x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

American Institute of Physics, Pattanayak et al, "Signature of silver phase percolation threshold in microscopically phase separated ternary $Ge_0.15Se_{0.85-x}Ag_x$ (0 .Itoreq. x .Itoreq. 0.20) glasses", Journal of Applied Physics, pp. 013515-1-013515-4, 2004.

Angell, C.A., Mobile Ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu—As—Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Axon Technologies Corporation, Technology Description: Programmable Metalization Cell(PMC), pp. 1-6 (Pre-May 2000).

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid State Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C. et al., Transition from S- to N-type differential negative resistance in Al—Al2O3—Ag2−xSe1+x thin film structures, Phys. Stat. Sol. (a) 74 (1982) 217-224.

Bernede, J.C., Influence du metal des electrodes sur les caracteristiques courant-tension des structures M—Ag2Se—M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A,; Fousenan't, E.; El Bouchairi, B.; Goureaux, G., Polarized memory switching effects in Ag2Se/Se/M thin film sandwiches, Thin solid films 97 (1982) 165-171.

Bondarev, V.N.; Pikhitsa, P.V., A dendrite model of current instability in RbAg4I5, Solid State Ionics 70/71 (1994) 72-76.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P., The maximum in glass transition temperature (Tg) near x=1/3 in GexSe1−x Glasses, Asian Journal of Physics (2000) 9, 709-72.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

(56) References Cited

OTHER PUBLICATIONS

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17.sup.th (1985) 833-36.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Philips, J.C., Broken chemical order and phase separation in GexSe1-x glasses, Solid state comm. 45 (1983) 183-185.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, theNetherlands, 2001, pp. 97-132.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As—Te—Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Deamaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag—Ge—Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2—xSe1+x/n—Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

Shimizu et al., The Photo-Erasable Memory Switching Effect of Ag Photo-Doped Chalcogenide Glasses, 46 B. Chem Soc. Japan, No. 12, pp. 3662-3365 (1973).

Snell, A.J.; Hajto, J.;Rose, M.J.; Osborne, L.S.; Holmes, A.; Owen, A.E.; Gibson, R.A.G., Analogue memory effects in metal/a-Si:H/ metal thin film structures, Mat. Res. Soc. Symp. Proc. V 297, 1993, 1017-1021.

Snell, A.J.; Lecomber, P.G.; Hajto, J.; Rose, M.J.; Owen, A.E.; Osborne, I.L., Analogue memory effects in metal/a-Si:H/ metal memory devices, J. Non-Cryst. Solids 137-138 (1991) 1257-1262.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As—Te glasses, Phys. Rev. B 48 (1993) 14650-14652.

Tranchant,S.;Peytavin,S.;Ribes,M.;Flank,A.M.;Dexpert,H.;Lagarde,J.P., Silver chalcogenide glasses Ag—Ge—Se: Ionic conduction and exafs structural investigation, Transport-structure relations in fast ion and mixed conductors Proceedings of the 6thRiso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H,; Sie, C.H.; Griener, J.D.; Raghavan, K.S., Electric field induced filament formation in As—Te—Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M—GeSe—M system, Mat. Chem. and Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Electrically erasable non-volatile memory via electrochemical deposition of multifractal aggregates, Ph.D. Dissertation, ASU 1998.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigiditypercolation threshold (<m>=2.4), J. Non-Cryst. Solids 151 (1992) 149-154.

* cited by examiner

POWER MANAGEMENT CONTROL AND CONTROLLING MEMORY REFRESH OPERATIONS

CROSS-REFERENCE TO RELATED APPLICATIONS

This application is a continuation of U.S. application Ser. No. 12/367,216, which was filed on Feb. 6, 2009, which is scheduled to issue as U.S. Pat. No. 8,619,485 on Dec. 31, 2013. which is a continuation of U.S. patent application Ser. No. 10/796,111, which was filed on Mar. 10, 2004, which issued as U.S. Pat. No. 7,583,551 on Apr. 17, 2007, the disclosures of which are incorporated herein by reference.

FIELD OF THE INVENTION

The present invention relates generally to memory, and more particularly controlling memory refresh operations in memory.

BACKGROUND OF THE INVENTION

An essential data processing component is memory, such as a random access memory (RAM). RAM allows the user to execute both read and write operations on memory cells. Typically, semiconductor RAM devices are volatile, in that stored data is lost once the power source is disconnected or removed. Typical examples of RAM devices include dynamic random access memory (DRAM), synchronous dynamic random access memory (SDRAM) and static random access memory (SRAM).

In recent years, the memory capacity, i.e., the number and density of memory cells in memory devices have been increasing. Accordingly, the size of each cell (including storage capacitor size) has been shrinking, which also shortens the cell's data holding time. Typically, each row in a memory device receives a stabilizing refresh command in the conventional standardized cycle, about every 64 milliseconds. However, with increasing cell number and density, it is becoming more and more difficult to stabilize all memory cells at least once within the stabilizing cycle, e.g., it requires more power as well as a significant portion of the available bandwidth.

DRAMS and SDRAMs are volatile in the sense that the stored data, typically in the form of charged and discharged capacitors contained in memory cells arranged in a large array, will dissipate the charge after a relatively short period of time because of a charge's natural tendency to distribute itself into a lower energy state. DRAM is particularly volatile in that each cell should be stabilized, i.e., refreshed, typically every 64 milliseconds, in order to retain information stored on its memory cells.

Recently, studies have been conducted on the use of chalcogenide glasses as ionic conductors which can be used to build non-volatile memory cells. One such non-volatile memory device, which uses chalcogenide glass to form non-volatile memory cells is known as a programmable conductor RAM (PCRAM). See, for example, U.S. Patent publication number 2002/0123248.

Although referred to as non-volatile memory elements, the PCRAM memory elements are more accurately nearly non-volatile memory ("NNV memory"). The NNV memory elements do require periodic refreshing, although the refreshing operations occur significantly more infrequently than refresh operations in standard volatile DRAM or SDRAM memory elements. Once a refreshing operation is complete, a memory device incorporating the NNV memory elements can be placed into an extremely low power state until either the system is returned to a normal operating state or until another refreshing operation is required.

A memory system may comprise many memory devices. Although the amount of time allotted to a refresh operation is conventionally pre-determined and therefore static, each memory device may require a different amount of time to complete the refresh operation. The difference in the amount of time required for a refresh operation is caused by a variety of factors. For example, the difference may stem from inaccuracies and inefficiencies in the performance of a refresh operation, or it may be caused by differences in memory architectures of a memory device. Furthermore, the time a device requires for a refresh operation may vary due to various factors, such as amount of memory that needs refreshing. For example, if a refresh operation is performed as a burst operation, with all cells in all devices being refreshed in a series of sequential operations, even a small variation of individual cell refresh times accumulates into significant differences in the refresh times for the entire device containing the individual cells.

The time allotted to perform a refresh operation is generally set at the maximum amount of time the devices could require to perform the refresh operation. Otherwise, if the time period is set too short, some devices may not complete the refresh operation before the time period expires. Thus, there is wasted time when the amount of time required for a refresh operation is shorter than the pre-determined, allotted refresh operation time.

Similarly, the frequency of refreshing a memory system is conventionally static and predetermined. However, many factors affect the minimum frequency necessary to ensure retention of stored information. For example, in a memory system that includes NNV memory elements, ambient temperature affects the volatility of the NNV memory elements—the ambient temperature affects the ability of the memory elements to retain a stored state.

It would be advantageous to have memory refresh techniques that reduce wasted time.

BRIEF SUMMARY OF THE INVENTION

Exemplary embodiments of the present invention provide memory refresh and power management circuitry whose operation can be affected by dynamic factors. The circuitry can also reduce time delays in refresh operations. The various embodiments of the invention may be used with any memory requiring refresh.

Rather than allotting a pre-determined amount of time to complete the refresh operation, the memory refresh circuitry of an exemplary embodiment provides a refresh complete signal indicating when a burst self-refresh operation is complete. In a system with multiple memory devices, the refresh complete signals from the devices are combined. A power management circuit receives the refresh complete signal when the refresh operation has been completed.

In another exemplary embodiment of the invention, a memory system monitors a condition, such as ambient or internal temperature, and initiates refresh operations based on the temperature. The system can include a circuit monitoring the ambient and internal temperatures, and the refresh circuitry can initiate a refresh operation in response. The refresh circuitry initiates a refresh operation based on either established set temperature points or the integration of temperature.

Another exemplary embodiment of the invention is a combination of the embodiments described above. For example in this exemplary embodiment, a memory system provides memory refresh circuitry whose operation can be affected by dynamic factors and monitors a condition, such as ambient or internal temperature, and initiates refresh operations based on the temperature.

BRIEF DESCRIPTION OF THE DRAWINGS

These and other features and advantages of the invention will be more readily understood from the following detailed description of the invention which is provided in connection with the accompanying drawings, in which.

DETAILED DESCRIPTION

In the following detailed description, reference is made to the accompanying drawings, which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
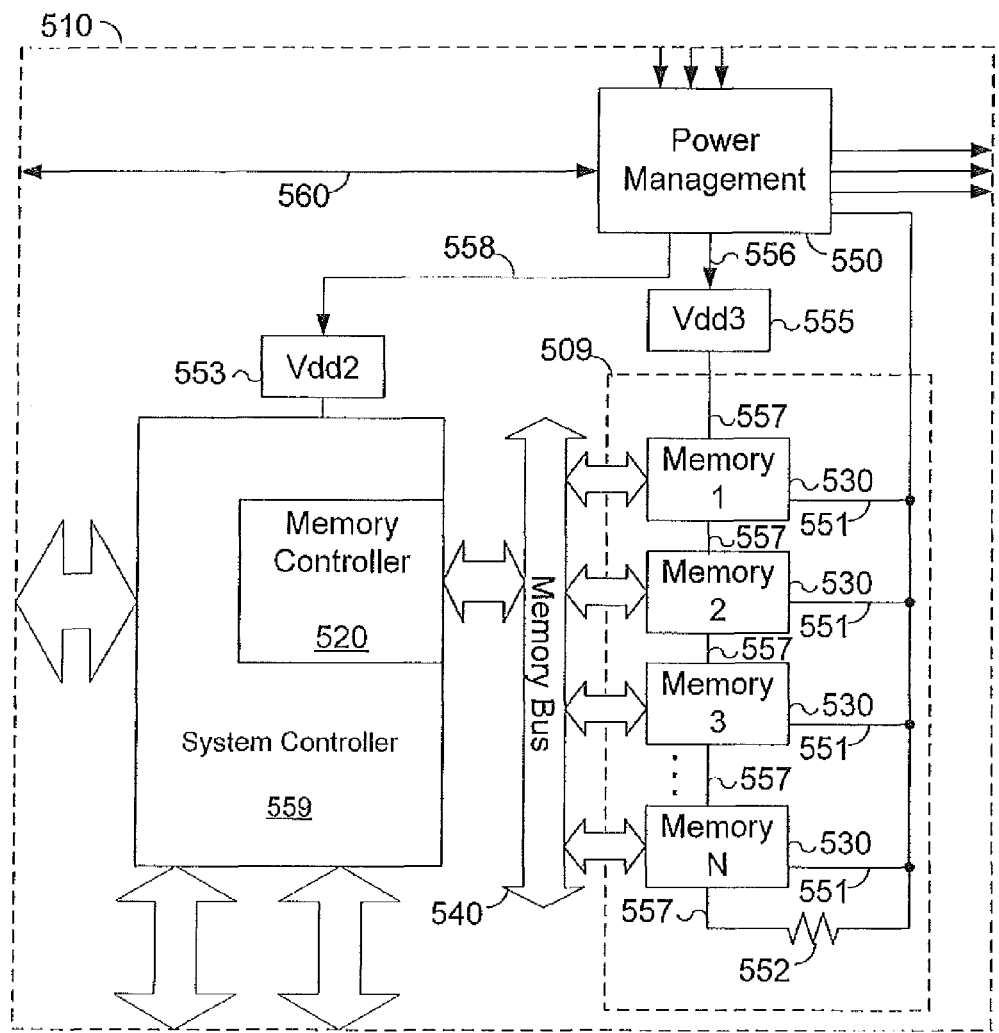
FIG. 1 depicts a block diagram of a memory system in accordance with an exemplary embodiment of the invention.

FIG. 1 depicts a memory system 510 in accordance with an exemplary embodiment of the invention. Memory system 510 includes a memory controller 520, memory devices 530, memory bus 540, power management controller 550, resistor 552, system controller 559, logic power supply 553, and memory power supply 555. Although shown with four (4) memory devices 530, memory system 510 can have any number of memory devices 530. Memory systems with larger numbers of memory devices 530, may require additional circuit, for example, the system may require multiple memory buses 540 and memory power supplies 555. A memory device 530 is described in greater detail below. The memory controller 520 is coupled to the memory devices 530 through memory bus 540. Through the memory bus 540, the memory controller 520 exchanges data and control signals with memory devices 530. For example, memory controller 520 provides a command indicating that data is to be written to a certain location of a particular memory device 530. Further, memory controller 520 also provides a command indicating when a memory device 530 should perform a refresh operation, or enter a standby self-refresh mode of operation. Data and other signals from memory devices 530 are provided to different parts of the memory system 510 through memory bus 540. Although the memory controller 520 is depicted as being incorporated into system controller 559, other implementations of the memory controller 520 and system controller 559 are possible.

As seen in FIG. 1, memory devices 530 are coupled to a memory power supply 555 (Vdd3) through line 557. Power supply 555 provides power to each memory device 530. Although shown as a single line in FIG. 1, line 557 is representative of several power lines that may couple the power supply 555 to a memory device 530. In implementation, multiple lines 557 are used for different power plane paths, where each line 557 is associated with a respective power plane. There may be a single or multiple power plane paths to each memory device 530.

Power management circuit 550 is coupled to memory power supply 555 and controls the supply voltage and therefore power provided to each memory device 530. Further, power management circuit 550 controls the power supplied to each memory device 530 on each power plane through each line 557. Power management circuit 550 is coupled to and exchanges control signals with system controller 559/memory controller 520 and other system components through communications bus 560. Power management circuit 550 is discussed in greater detail below.

The power management circuit 550 is coupled to memory devices 530 through line 551 to each memory device 530. The pullup resistor 552 is also coupled to line 551 and line 557. Through line 551 power management circuit 550 receives a "refresh complete" signal from the memory devices 530 indicating that the memory devices 530 have completed a burst self-refresh operation. The refresh complete signal is advantageous, especially for NNV memory devices, because it allows for improved refresh operations, as described below. In an exemplary embodiment, line 551 carries a signal to power management circuit 550 indicating first and second states. In the first state, the signal carried on line 551 indicates to the power management circuit 550 that the burst self-refresh operation is under way. In a second state, the signal carried on line 551 indicates to the power management circuit 550 that the burst self-refresh operation is no longer under way, i.e., the burst self-refresh operation is completed.

In one embodiment of the invention, described below in relation to FIG. 1, the signal carried on line 553 is either at a supplied voltage level Vdd3 or the signal is at or near signal ground. The Refresh Complete outputs of all of the memory devices 530 on lines 551 are in effect logically ORed to provide a signal on line 551 indicating whether any of memory devices 530 is currently performing burst self-refresh, a configuration referred to as "wired-OR" or "dynamic OR." Each memory device 530 can selectively couple line 551 to signal ground thus pulling it down from Vdd3. If any of the memory devices 530 couples line 551 to signal ground, then the signal on line 551 received by the power management circuit 550 is at or near signal ground, indicating that a refresh operation is currently underway. If none of the memory devices 530 couple line 551 to ground, resistor 552 pulls down the refresh complete line 551 to the voltage on Vdd3 and the signal on line 551 received by the power management circuit 550 will be approximately Vdd3, indicating that all memory devices 530 have completed their burst self-refresh operation.

Figure 2:
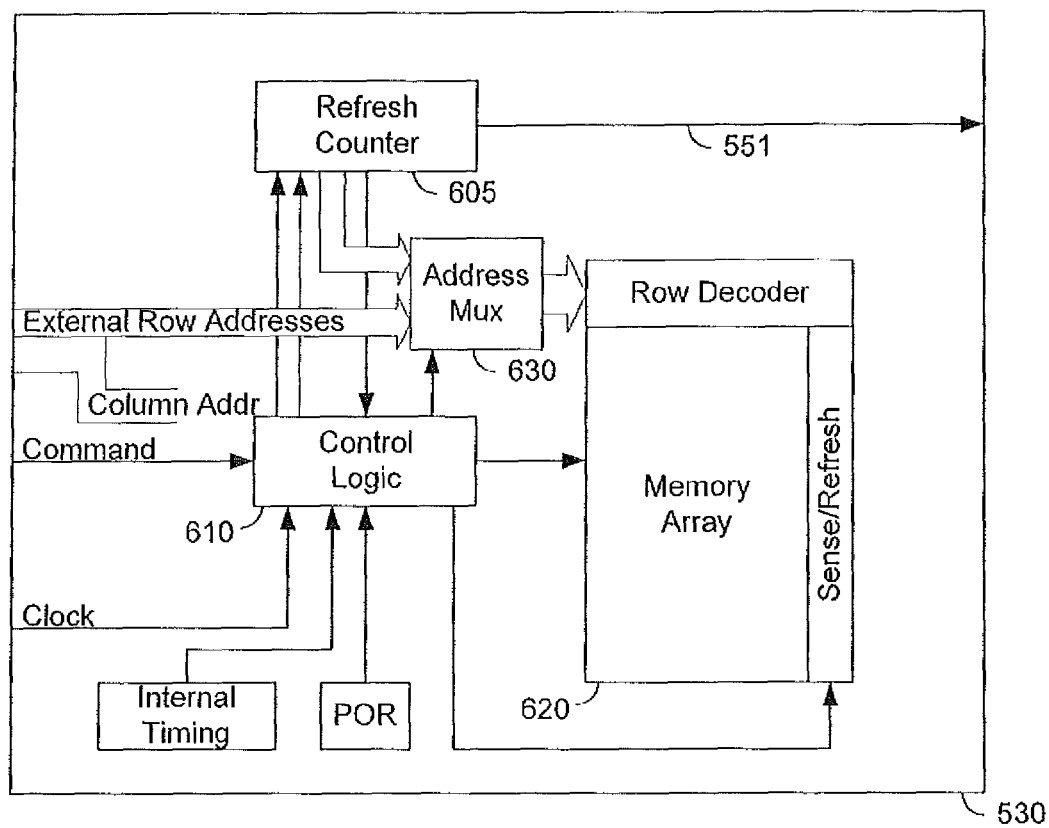
FIG. 2 shows a block diagram of a memory device in FIG. 1 in greater detail in accordance with an exemplary embodiment of the invention.

FIG. 2 depicts a portion of the memory device 530 of FIG. 1 in greater detail. Memory device 530 includes a control logic circuit 610, a memory array 620, an address multiplexer 630 and a refresh counter 605. Although shown with only one representative memory array 620, memory device 530 can include any number of memory arrays 620. Although shown with representative elements, memory device 530 may include additional memory or logic circuits not shown or described. Control logic circuit 610 controls access to the memory array(s) 620, and more specifically to the storage elements of the memory array 620. Although not shown, control logic 610 receives control signals from memory controller 520 (FIG. 1), which indicate the memory operation to occur, e.g., a read, write, or refresh operation. Further, the control logic 610 receives control signals from refresh counter 605 during a self-refresh or burst self-refresh operation. Further, the memory controller 520 (FIG. 1) provides a desired memory address to the memory device 530 (FIG. 2) which in turn is provided through multiplexer 630 to the memory array 620 to enable and control access to desired memory element(s) of the memory array 620. The memory address provided by the memory controller 520 is either multiplexed or un-multiplexed. If the address is multiplexed, it may be multiplexed with itself and/or with other signal lines, including, but not limited to, the data lines of the device as is conventionally known.

Control logic 610 provides a signal to the address multiplexer 630 to indicate the source of the inputted address that is provided to access a row in the memory array 620. For example, in a first, standard operational mode, the address multiplexer 630 provides row addresses received from an outside circuit, e.g., the memory controller 520 (FIG. 1), to the memory array 620. In a second, refresh operation mode, the address multiplexer 630 provides row addresses received from the refresh counter 605 to the memory array 620. During the refresh operation, control logic 610 also provides signals to sense/refresh components of memory array 620 so that the value stored in a complete row of addressed memory elements is sensed and refreshed. Column addresses and column decoding are not shown or described with respect to FIG. 2, but are well known by those with skill in the art.

Refresh counter 605 (FIG. 2) controls the operation of its associated memory device 530 by providing a single address during a single self-refresh cycle or a series of addresses during a burst self-refresh operation. The addresses can be obtained by incrementing the refresh counter 605 at the completion of a refresh cycle to the memory array 620. The control logic circuit 610 may receive commands from the memory controller 520 (FIG. 1) indicating that a refresh operation should begin. These commanded refresh cycles may occur as in standard dynamic random access memory (DRAM) devices that are currently available. In a preferred embodiment of the invention, a burst self-refresh operation is included, which allows the entire memory array to be refreshed by a single command. A value of the refresh circuit 605 corresponds to an address in the memory array 620. For a commanded burst self-refresh operation, the refresh counter 605 is automatically reset to a value corresponding to the first row in a memory array 620, which is then refreshed. The value in the refresh counter 605 is incremented for each refresh of a row in the memory array 620 until the maximum value of the refresh counter 605 is reached. When the value of the refresh counter 605 is the maximum value then all of addresses of the memory array 620 will have been refreshed.

The automatic burst self-refresh operation is initiated by the control logic 610 as it senses certain conditions. These conditions may include, for example, time or temperature factors. For example, the condition of all inputs to the control logic 610 being held near signal ground would indicate to the control logic 610 the condition for an automatic burst self-refresh. During a burst self-refresh, refresh counter 605 is initially reset and will pull the signal on line 551 to ground. Following the refresh of each row of the memory array 620 the refresh counter 605 is incremented. The value of refresh counter 605 is provided as a row address to the address multiplexer 630 to access a row of the memory array 620 that is to be refreshed. For example, in operation, the refresh counter 605 first provides an address corresponding to the first row of the memory array 620 to the address multiplexer 630. After each row of the memory array 620 has been refreshed, the refresh counter 605 provides a new address corresponding to the next row of the memory array 620. When the memory array 620 has completed a refresh operation, e.g., all the elements of the memory array 620 have been refreshed, the refresh counter 605 will overflow, indicated by the release of signal on line 551, allowing it to return to Vdd3 if all other memory devices 530 have completed the refresh operation. This provides a signal to the power management circuit 550 (FIG. 1) indicating that the refresh operation is complete in all of the memory devices 530.

Figure 3:
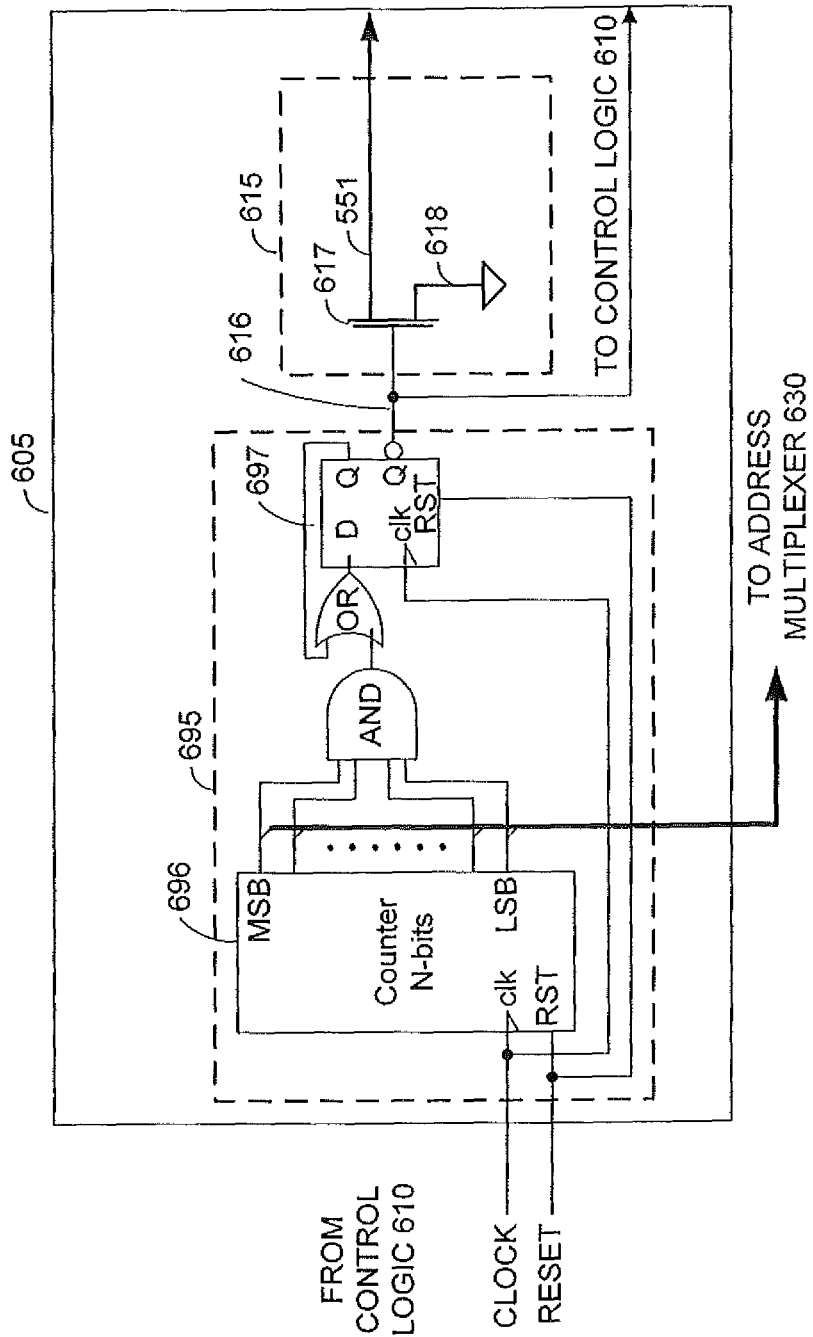
FIG. 3 shows a block diagram of the refresh counter of FIG. 2 in greater detail.

FIG. 3 depicts an implementation of the refresh counter 605 of FIG. 2 in greater detail. Refresh counter 605 includes an address and control counter circuit 695 and a refresh complete circuit 615. Address and control counter circuit 695 is coupled to the refresh complete circuit 615, the control logic circuit 610 (FIG. 2), and the address multiplexer 630 (FIG. 2) and also receives a clock signal. As is conventionally known, address and control circuit 695 provides and receives control signals from control logic 610 including a reset signal as shown, and provides address signals (used for a refresh operation) to address multiplexer 630. Address and control circuit 695 provides a signal to the refresh complete circuit 615 indicating the status of the burst self-refresh operation. Address and control circuit 695 can therefore be implemented as a conventional counter or other suitable circuitry that can reset a count to zero, provide the count as an address, increment the count to the next address in response to a clock signal, and provide a signal on line 616 when the count reaches a maximum address value.

In an exemplary embodiment of the present invention, refresh complete circuit 615 includes a switch 617, e.g., a transistor, where the source region of the transistor is coupled to signal ground through line 618. The drain region of switch 617 is coupled to line 551. When transistor switch 617 is closed, or turned on, line 551, is coupled to signal ground through line 618. When switch 617 is open, line 551 is isolated from signal ground through line 618.

Line 616 can control switch 617 based on the value in a counter 696 in circuit 695. For example, line 616 indicates when the maximum value of the N-bit refresh counter 696 has been reached, i.e., when all of the addresses have been refreshed. In a preferred embodiment, when a burst self-refresh operation is underway in the memory device 530, the flip-flop 697 output Q will be off, and output Q* will be on, and line 616 can close switch 617, coupling line 553 to ground. When the burst self-refresh operation has been completed in the memory device 530, as indicated by the maximum value being reached in the counter 696, the flip-flop 697 output Q will be on, and output Q* will be off, and line 616 can open switch 617, not coupling line 553 to ground. Thus, memory device 530 provides a signal indicating whether its burst self-refresh operation has been completed by either coupling line 553 to ground or not coupling line 553 to ground. In one embodiment, refresh complete circuit 615 is an open drain comprised of an N-channel MOSFET whose source is tied to ground, e.g., VSS, and whose drain is tied to line 553 (FIG. 1) through line 551.

Figure 4:
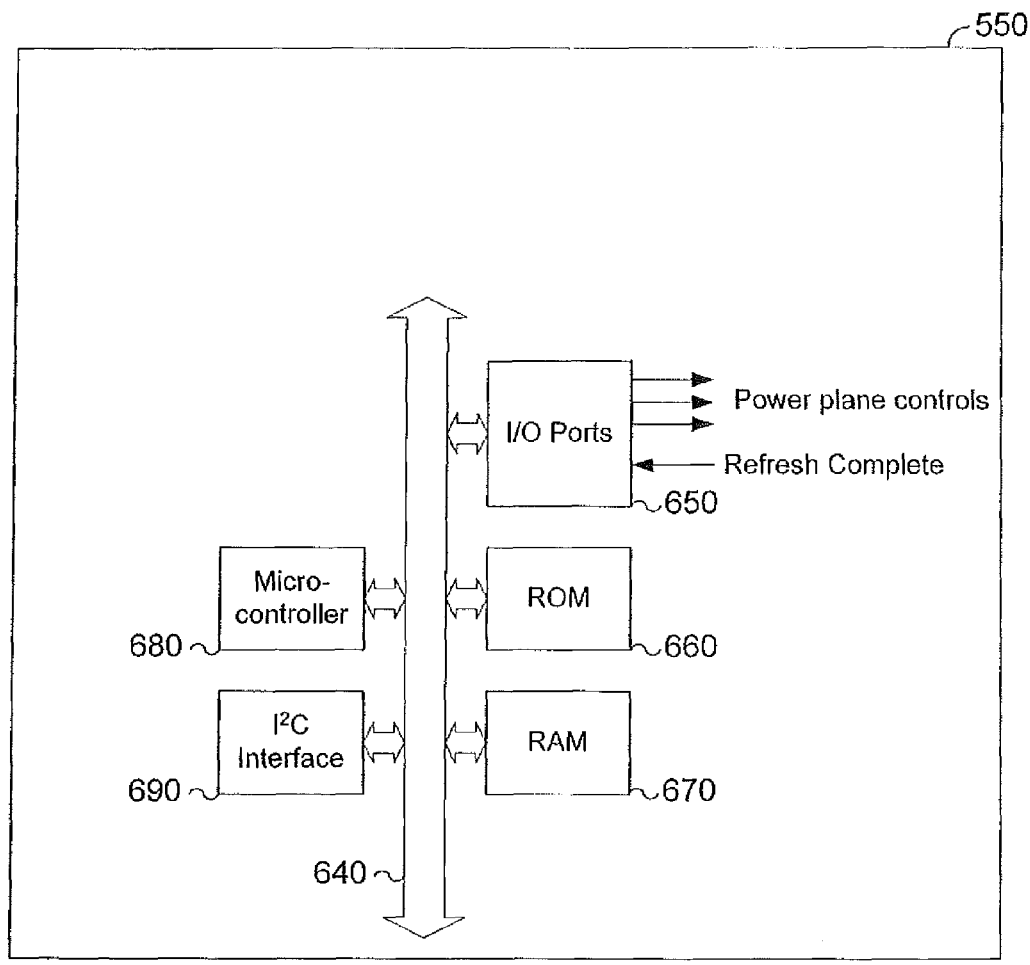
FIG. 4 shows a block diagram of the power management controller of FIG. 1 in greater detail in accordance with an exemplary embodiment of the invention.

FIG. 4 shows an implementation of the power management controller 550 of FIG. 1 in greater detail. Power management controller 550 includes a microcontroller 680, bus 640, I/O ports 650, ROM 660, RAM 670, and inter IC (I2C) interface 690. Microcontroller 680 controls the operation of the power management controller 550 based on predetermined, preprogrammed criteria. Bus 640 couples I/O ports 650, ROM 660, RAM 670, and inter IC (12C) interface 690 enabling these devices to exchange data and control signals. I/O ports 650 provide input and output connections to other devices and signals. For example, an output is coupled to a memory power plane controller (not shown) within the power supply 555 (FIG. 1) to enable the power management controller 550 to control the supply voltage provided to a memory device 530. If a memory system 510 has more than one memory power plane, the power management controller 550 is coupled to the memory power plane controller for each power plane within the power supply 555.

As seen in FIG. 4, the power management controller 550 includes storage areas ROM 660 and RAM 620. Further, the power management controller 550 includes an inter IC (12C) interface 690 to permit coupling the power management controller 550 to another IC bus (or busses). Most often such a bus will allow communication with a main system processor.

A burst self-refresh operation of a NNV memory device(s) 530 may be initiated during a time when the system is in a standby, power-saving mode. The burst self-refresh capability allows most of the memory system to remain in a power-down state while the burst self-refresh operation occurs. During an operation to burst self-refresh a memory device 530, the power management controller 550 provides a signal to the memory power supply 555 indicating that power should be provided to memory device(s) 530 or a particular memory power plane coupled to memory device(s) 530. Further, the control logic 610 (FIG. 2) of each memory device 530 will detect the conditions indicating that a refresh operation should occur. The control logic 610 (FIG. 2) provides a reset signal pulse to the refresh counter 605 and begins performing refresh operations.

The refresh counter 605 provides addresses for refresh operation of memory array 620 (FIG. 2) through address multiplexor 630 (FIG. 2) and is incremented after receiving the appropriate clock signal from control logic 610. When the refresh operation is completed, memory device 530 provides its 'refresh complete' signal by releasing its line 551 (FIG. 3). If memory device 530 is the last memory devices 530 to complete a refresh operation or if only one memory device 530 is being refreshed, line 551 returns to Vdd3, providing a refresh complete signal to I/O port 650. When the power management controller 550 receives the refresh complete signal through I/O port 650, the power management controller 550 returns the memory devices 530 and power supply 555 to the power-off state.

A memory system in a higher power setting does not require burst self-refresh and may be refreshed through conventional refresh cycles as understood by those with skill in the art.

Power management circuit 550 differs from conventional power management circuits in that power management circuit 550 receives a refresh complete signal that indicates when all the memory devices 530 have completed refreshing their respective memory arrays 620. In one embodiment, a refresh complete signal is received through I/O ports 650. Although referred to as a single signal, the refresh complete signal received can be at least two different voltages signifying different statuses. A first signal indicates that a refresh operation has been completed (i.e., 'refresh complete' signal) and the second signal indicates that a refresh operation in progress has not been completed (i.e., 'refresh not complete' signal). Systems with multiple memory planes may have a refresh complete signal for each memory plane.

Power management circuit 550 also differs from conventional power management circuits in that the microcontroller 680 is programmed to respond to the dynamic input of the refresh complete signal. Rather than waiting a predetermined time period to return the memory to its state prior to initiating the memory refresh operation, microcontroller 680 waits until it receives a refresh complete signal and then returns the memory to its state prior to initiating the memory refresh operation. Thus, the memory system responds dynamically to the completion of a memory refresh operation and can reduce the amount of time between the completion of a memory refresh operation and the return of the memory to its state prior to initiating the memory refresh operation. This is desirable because it allows a non-static time for the refresh operation as may be required due to the nature of the NNV memory technology, and can reduce wasted time by reducing or eliminating time delay after completion of a refresh operation before power management is initiated.

Figure 5:
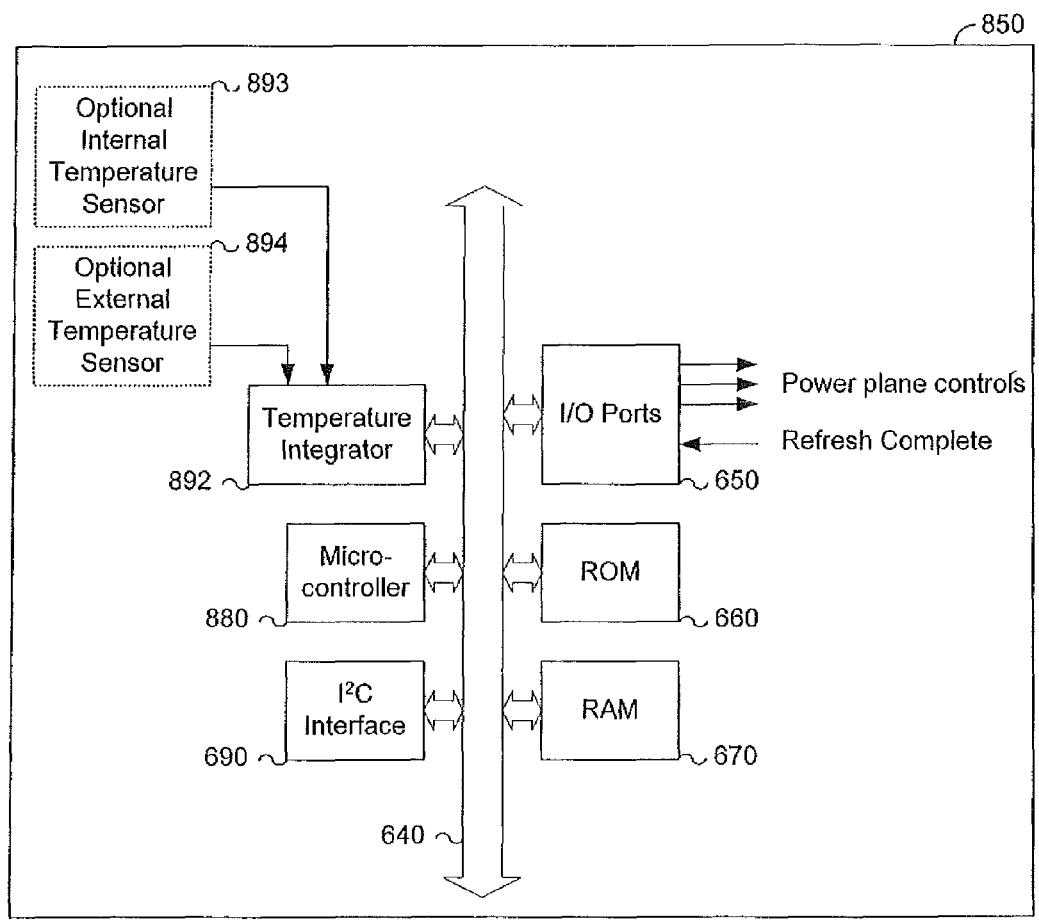
FIG. 5 shows a block diagram of the power management controller of FIG. 1 in greater detail in accordance with another exemplary embodiment of the invention.

In another exemplary embodiment of the present invention, the initiation of a refresh operation is done dynamically. FIG. 5 depicts the power management controller 850. Similar to power management controller 550 (FIG. 4), power management controller 850 includes a microcontroller 880, bus 640, I/O ports 650, ROM 660, RAM 670, and inter IC (12C) interface 690. Further, power management controller 850 includes a temperature integrator 892 and may include optional internal and external temperature sensors 893, 894.

Power management circuit 850 differs from power management circuit 550 in that the microcontroller 880 is programmed to respond to the input of the temperature integrator 892. In addition to other events that cause a burst self-refresh operation to occur in the memory device 530, microcontroller 880 is adapted to receive a signal from the temperature integrator 892 indicating that a burst self-refresh operation should occur. In other words, microcontroller 880 dynamically determines frequency of burst self-refresh operations, based on factors such as ambient or internal temperature or other conditions occurring during memory system operation.

Temperature integrator 892 provides a signal indicating that a burst self-refresh operation should occur based on predetermined criteria. In an aspect of the exemplary embodiment of the invention, the temperature integrator 892 receives temperature sensor signals from an internal temperature sensor 893, an external temperature sensor 894, or both an internal and external temperature sensor 893, 894. An external temperature sensor 894 is located off of the memory device 530 and measures the ambient temperature conditions. An internal temperature sensor 893 is located on the memory device 530 and measures the temperature conditions within the memory device 530. In another embodiment the internal temperature sensor 893 is incorporated into the memory device 530. In another embodiment, the temperature sensor 893 integrated into the power management control.

Temperature may affect different NNV memory differently; hence, each NNV memory may require a memory refresh operation at a different temperature based on the effects of temperature on memory elements. In one embodiment, the temperature integrator 892 is preprogrammed to require differing rates of refresh operation at predetermined temperatures, e.g., trip points measured by one of the temperature sensors 893, 894. For example, when one of the temperature sensors 893, 894 indicates 80 degrees Celsius, then the temperature integrator 892 provides a signal to the microcontroller 880 that refresh operations should be initiated at a different rate than for temperatures below 80 degrees Celsius. Similarly, in another embodiment, the temperature integrator 892 is preprogrammed to require a refresh operation based on predetermined values of the integration of temperatures and times spent at each temperature. The programming also incorporates the time since the last refresh operation occurred. In either embodiment, the chemistry of the memory cells affects the required frequency of refreshing. For example, a first type of memory having a first memory cell chemistry may need to be refreshed more often and starting at a lower temperature than a second type of memory having a second memory cell chemistry. Although described with reference to temperatures, other conditions can be monitored to initiate refresh operations. For example, ambient humidity can be monitored and trip points established at which refresh is monitored.

Figure 6:
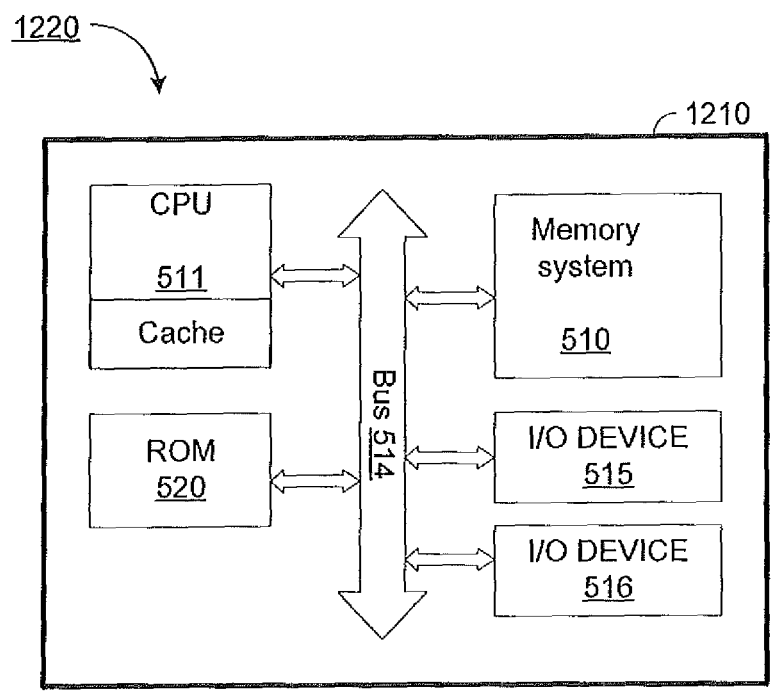
FIG. 6 shows a memory system as in FIGS. 1-5 integrated on a semiconductor chip.

FIG. 6 depicts a memory system 510, such as described in connection with FIGS. 1-5, included on an integrated circuit (IC) substrate 1210 to form a complete System-On-a-Chip (SOC) device. The IC 1210 includes CPU 511 with a cache, ROM 520, Bus 514, I/O devices 515, 516, and memory system 510. The resulting IC 1210 may be developed to perform a specific function or a wide range of programmable functions. IC 1210 may be incorporated into a processor system or stand-alone as a complete system.

Figure 7:
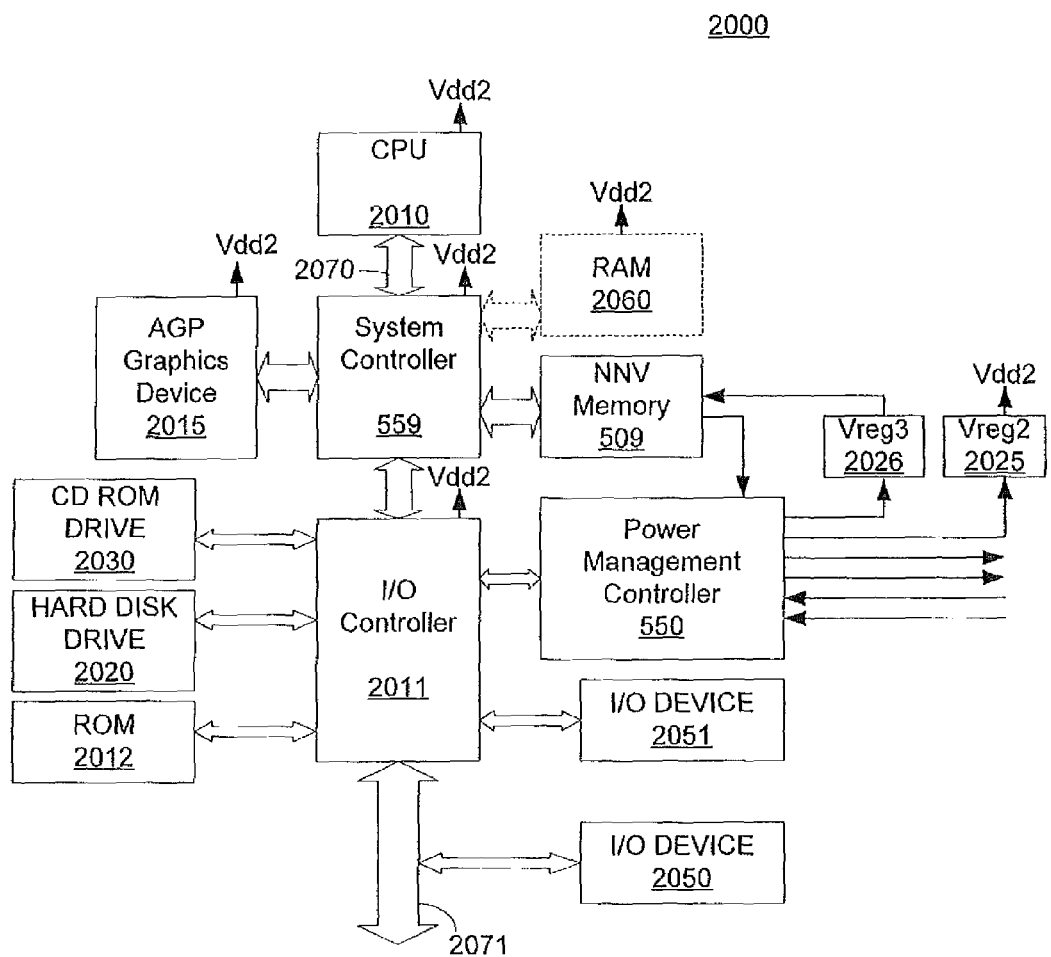
FIG. 7 shows a memory system as in FIGS. 1-5 integrated in a processing system.

FIG. 7 shows system 2000, a typical processor based system modified to include a NNV memory system having burst self-refresh capabilities 510. Processor based systems exemplify systems of digital circuits that could include and benefit greatly from such a memory device. System 2000 includes central processing unit (CPU) 2010, system controller 559, AGP graphics device 2015, CD ROM drive 2030, hard disk 20220, ROM 2012, I/O controller 2011, RAM 2060, NNV memory 509, power management controller 550, I/O devices 2050, 2051, and Voltage regulators Vreg2 2025, Vreg3 2026. CPU 2010, such as an Intel™ Pentium-4™, Centurion™ or XScale™ processor, that communicate directly or indirectly with various devices over bus 2070. Input/output (I/O) devices 2050 and 2051 and other devices provide communication into and out of system 2000. Other devices provide memory, illustratively including an optional dynamic random access memory (RAM) 2060, and one or more peripheral storage devices such as hard disk drive 2020 and compact disk (CD) ROM drive 2030. This system also includes one or more instances of NNV memory 530.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although the invention has been described in connection with specific circuits that dynamically OR refresh complete signals, the invention may be practiced with many other configurations without departing from the spirit and scope of the inventions, such as keeping refresh complete signals separate or by combining them in other ways, such as dynamic Ending or daisy-chaining. Accordingly, the invention is not limited by the foregoing description or drawings, but is only limited by the scope of the appended claims.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A system, comprising:
 a plurality of memory devices, each comprising:
  a memory array; and
  a refresh circuit comprising control logic for monitoring predetermined conditions of the memory array and for providing a refresh complete signal when a refresh operation on the memory array is complete, based on the monitoring of the memory device;
 the system further comprising:
 a power management circuit coupled to the plurality of memory devices for controlling power provided to the memory devices based on a combined refresh complete signal from the plurality of memory devices; and
 a programmable controller adapted to receive criteria to control the operation of the power management circuit.

2. The system of claim 1, wherein the memory refresh circuit can perform a burst self-refresh operation.

3. The system of claim 2, wherein the memory refresh circuit performs the burst self-refresh operation if the control logic senses a predetermined condition when monitoring the memory device.

4. The system of claim 1, wherein the memory refresh circuit includes a refresh counter.

5. The system of claim 4, wherein the control logic controls the refresh counter.

6. The system of claim 4, wherein the refresh counter provides a signal indicating when said refresh operation is complete.

7. The system of claim 1, wherein the power management circuit causes the burst self-refresh operation to occur in the memory devices if the programmable controller receives a signal indicating that the burst self-refresh operation should occur.

8. The system of claim 7, further comprising a temperature integration circuit for providing the signal to the programmable controller from which the programmable controller determines if a burst self-refresh operation should occur based upon programmed criteria.

9. The system of claim 8, wherein the temperature integration circuit is adapted to receive signals from a temperature sensor for measuring temperature.

10. The system of claim 9, wherein the temperature sensor is located outside the memory device.

11. The system of claim 10, wherein the temperature sensor is located inside the memory device.

12. The system of claim 1 wherein the programmable controller is programmed to respond to receipt of a refresh complete signal.

* * * * *